United States Patent [19]

Hatanaka

[11] Patent Number: 5,699,010
[45] Date of Patent: Dec. 16, 1997

[54] DIFFERENTIAL AMPLIFIER CIRCUIT

[75] Inventor: Kazuomi Hatanaka, Ikoma, Japan

[73] Assignee: Sharp Kabushiki Kaisha, Osaka, Japan

[21] Appl. No.: 667,708

[22] Filed: Jun. 21, 1996

[30] Foreign Application Priority Data

Jun. 21, 1995 [JP] Japan ................. P7-154970

[51] Int. Cl.$^6$ ................................................ H03F 3/45
[52] U.S. Cl. ................ 327/563; 327/53; 327/66; 330/149; 330/252; 330/257
[58] Field of Search ................ 327/560, 561, 327/562, 563, 52, 53, 65, 66, 67, 72, 80; 330/252, 253, 255, 257, 262, 263, 269, 288, 254, 261, 149

[56] References Cited

U.S. PATENT DOCUMENTS 5,382,917   1/1995   Miyake et al. ................. 330/257
5,399,991   3/1995   Moraveji ....................... 330/255
5,491,455   2/1996   Kuo ............................ 330/257

FOREIGN PATENT DOCUMENTS 621817    1/1994    Japan ................. H03F 3/45
6132742   5/1994    Japan ................. H03F 3/45

*Primary Examiner*—Timothy P. Callahan
*Assistant Examiner*—Terry L. Englund

[57] ABSTRACT

At the input sides of matched first and second differential amplifiers 11 and 12, first and second input buffers 21 and 22, and third and fourth input buffers 23 and 24 are respectively connected. In input transistors Q5 and Q8 in the first and second input buffers 21 and 22, emitter currents corresponding to the collector currents of differential transistors Q3 and Q4 of the second differential amplifier 12 flow by using current mirror circuits. Changes of base-emitter voltage of the PNP transistors Q5 and Q8, and changes of base-emitter voltage of NPN transistors Q1 and Q2 cancel each other, and an output voltage improved in linearity is obtained between a negative phase output terminal 33 and a positive phase output terminal 34.

6 Claims, 5 Drawing Sheets

DIFFERENTIAL AMPLIFIER CIRCUIT

BACKGROUND OF THE INVENTION

1. Field of the Invention

The present invention relates to a differential amplifier circuit used for amplifying an analog signal in a semiconductor integrated circuit.

2. Description of the Related Art

Differential amplifier circuits have been hitherto used widely in semiconductor integrated circuits. In semiconductor integrated circuits, it is easy to compose a pair of circuits matched in characteristic, and they are widely used for amplifying analog signals and the like. For example, Japanese Unexamined Patent Publication JP-A 6-21817 (1994) discloses a prior art relating to improvement of a differential amplifier circuit used in a series-parallel type A/D converter for converting an analog signal to a digital signal.

Another prior art disclosed in Japanese Unexamined Patent Publication JP-A 6-132742 (1994) is directed to improve the linearity of differential amplifier by using two amplifiers of the same constitution.

FIG. 5 shows a constitution of a typical differential amplifier circuit widely employed hitherto. Bipolar transistors Qa and Qb of NPN type compose a differential pair. The bases of transistors Qa and Qb are connected to a positive phase input terminal 1 and a negative phase input terminal 2, respectively. The collectors of the transistors Qa and Qb are connected to a negative phase output terminal 3 and a positive phase output terminal 4, respectively. Resistances Ra and Rb are connected between the collectors of the transistors Qa and Qb and a positive power source terminal 5, respectively. A common resistance R is inserted between the emitters of the transistors Qa and Qb. The emitters of the transistors Qa and Qb are connected to the collectors of NPN type transistors Qc and Qd, respectively. The emitters of the transistors Qc and Qd are connected to a negative power source terminal 6 through resistances Rc and Rd, respectively. The bases of the transistors Qc and Qd are commonly connected to the base of an NPN transistor Qe. The emitter of the transistor Qe is connected to the negative power source terminal 6 through a resistance Re. The transistors Qa and Qb and the resistors R, Ra and Rb compose a differential amplifier 7, and the transistors Qc, Qd and Qe and the resistances Re, Rd and Re compose a constant current source 8.

The transistors Qa and Qb have almost the same characteristics, and the transistors Qc and Qd have the same characteristics, too. The value of the resistance Ra is the same as that of the resistance Rb, and the resistances Rc and Rd are also of the same resistance value. By adjusting the current flowing in a bias input terminal 9 connected commonly to the base and collector of the transistor Qe, constant no-signal current I is allowed to flow between the collectors and emitters of the transistors Qc and Qd.

Supposing input voltages of the positive phase input terminal 1 and negative phase input terminal 2 to be V1 and V2, respectively, current $\Delta i$ flows in the common resistance R depending on the input potential difference $\Delta V=V1-V2$. At this time, the potential drop of the resistance Ra connected to the collector of the transistor Qa is Ra (I+$\Delta i$), and the potential drop of the resistance Rb connected to the collector of the transistor Qb is Rb (I-$\Delta i$). Since Ra=Rb, supposing them to be Ro, the voltage between the output terminals of the positive phase output terminal 4 and negative phase output terminal 3, that is, the differential output voltage Vo=Vo2-Vo1, is expressed as shown in equation 1.

$$Vo = Vcc - Ro \cdot (I - \Delta i) - (Vcc - Ro \cdot (I + \Delta i)) = 2 \cdot Ro \cdot \Delta i \quad (1)$$

Although $\Delta i$ in equation 1 varies with input difference voltage, a difference of $\Delta i \times 2$ occurs in the collector current of the transistors Qa and Qb composing a differential pair. If the characteristics of the transistors Qa and Qb are perfectly matched, the collector current is different, and hence linearity to the input difference voltage $\Delta V$ is not kept. To consider it quantitatively, the differential amplifier 7 in FIG. 5 is equally divided into two sections, and the bias potential when no differential signal is contained in the input is supposed to be V0. In no-signal condition, the base input of the transistor Qa is V1=V0. That is, when there is no signal, the following equation 2 is obtained as the potential of the division point of the resistance R divided into two sections.

$$V0 - VBE0 = V0 - (kT/q) \cdot \ln(I/Is) \quad (2)$$

where VBE0 is the base-emitter voltage of the transistor Qa when there is no signal, that is, at input voltage=V0, k is Boltzmann's constant, T is the absolute temperature, q is charge on an electron, and Is is saturation reverse current of the transistor Qa. When the input terminal voltage is V1, the output current component $\Delta i$ is expressed in equation 3.

$$\begin{aligned}\Delta i &= (1/(R/2)) \cdot \{V1 - VBE1 - (V0 - VBE0)\} \\ &= (1/(R/2)) \cdot \{V1 - (kT/q) \cdot \ln((I+\Delta i)/Is) - \\ &\quad V0 + (kT/q) \cdot \ln(I/Is)\} \\ &= (1/(R/2)) \cdot \{V1 - V0 - (kT/q) \cdot \ln(1 + \Delta i/I)\}\end{aligned} \quad (3)$$

where VBE1 is the base-emitter voltage of the transistor Qa when the input voltage is V1. In equation 3, $\Delta i/I$ is a nonlinearity factor. Because of this nonlinearity, the distortion factor of the output of the differential amplifier 7 increases, the dynamic range of input is limited, and other unfavorable phenomena occur.

In the prior art disclosed in Japanese Unexamined Patent Publication JP-A 6-21817 (1994), the linearity of the differential amplifier is improved by using a differential pair. To cancel an error of VBE, the operating current of the emitter follower of the output is manipulated. In the prior art disclosed in Japanese Unexamined Patent Publication JP-A 6-132742 (1994), a circuit for differentially coupling two amplifiers is provided. In these two prior arts, method for correcting $V_{BE}$ of the input side transistor is not disclosed.

SUMMARY OF THE INVENTION

It is hence an object of the invention to provide a differential amplifier circuit capable of ensuring the linearity, between an input and an output of a differential amplifier circuit using bipolar transistors, in a wide range, by, correcting nonlinearity, of base-emitter voltage. The invention provides a differential amplifier circuit comprising:

a first differential amplifier possessing bipolar transistors at the input side thereof, a second differential amplifier constituted to be matched with the first differential amplifier, first and second input buffers arranged at the input side of the first differential amplifier, and current feeding means for feeding the output current of the second differential amplifier as operating current of the first and second input buffers.

In the differential amplifier circuit of the invention, the current feeding means comprises a current mirror circuit.

In the differential amplifier circuit of the invention, third and fourth input buffers are arranged at the input side of the second differential amplifier.

The invention further provides a differential amplifier circuit for deriving an output corresponding to a potential difference between potentials inputted to a pair of input terminals, from between a pair of output terminals, the differential amplifier comprising:

- a first differential amplifier possessing a pair of first differential bipolar transistors of one conductive type of NPN and PNP types, between whose emitters a first resistance is inserted, and whose collectors are connected to the pair of output terminals, respectively;
- a first input buffer provided with a first input transistor of the other conductive type of NPN type and PNP type, different from the conductive type of the first differential transistors, whose emitter is connected to the base of one of the pair of first differential transistors, and whose base is connected to one of the pair of input terminals;
- a second input buffer provided with a second input transistor of the same conductive type as the first input transistor, having nearly the same characteristics as the first input transistor has, whose emitter is connected to the base of the other of the pair of first differential transistors, and whose base is connected to the other of the pair of input terminals;
- a second differential amplifier possessing a pair of second differential transistors of the same conductive type as the first differential transistors, having almost the same features as the first differential transistors, between whose emitters a second resistance is inserted;
- a third input buffer interposed between the base of one of the second differential transistors and the one input terminal, and
- a fourth input buffer interposed between the base of the other of the second differential transistors and the other input terminal,
- wherein the first and second input buffers transmit the currents corresponding to the collector currents of the one and the other of the second differential transistors, into the first and second input transistors, respectively.

In the differential amplifier circuit of the invention, the first and second input buffers are respectively provided with current mirror circuits, transmit the collector currents of the second differential transistors to the input sides of the current mirror circuits, and feed current to the emitters of the first and second input transistors from the output sides of the current mirror circuits, respectively.

In the differential amplifier of the invention, the third and fourth input buffers have the same constitution as the first and second input buffers, and possesses third and fourth input transistors inserted between the respective bases of the second differential transistors and the respective input terminals, the third and fourth input transistors which are driven at a constant current. According to the invention, between a pair of input terminals and both ends of the first resistance, a base-emitter junction of the first and second input transistors, one base-emitter junction and the other base-emitter junction of the first differential transistors are interposed. The first and second input transistors and the first differential transistors are bipolar transistors, which are different in conductive type, and the voltages occurring in the base-emitter junctions are different in polarity, and hence cancel each other. The first and second input buffers containing first and second input transistors transmit the current corresponding to the collector current of the second differential transistors whose bases are connected to the input terminal through the third and fourth input buffers, respectively, into the first and second input transistors, and hence fluctuations due to current changes also cancel each other to be suppressed, thereby correcting the nonlinearity.

Also according to the invention, the first and second input buffers transmit the collector current of the second differential transistors to the input side of the current mirror circuit. From the output side of the current mirror circuit, the current is supplied to the first and second input transistor emitters, and therefore the current corresponding to the collector current of the second differential transistors can be passed into the first and second input transistors. In the second differential transistors, a collector current nearly the same as in the first differential transistors flows depending on the difference of potentials inputted between the input terminals, and hence a current corresponding to the input potential difference is allowed to flow also into the first and second input transistors, so that the nonlinearity can be effectively corrected.

According to the invention, moreover, the third and fourth input buffers have the same constitution as the first and second input buffers have, and are driven at a constant current through the third and fourth input transistors interposed between the input terminal and the base of the second differential transistor. Since the first to fourth input buffers can be composed identically, the operation of the second differential transistors and the operation of the first differential transistors can be almost matched with the operation of the first differential transistors depending on the potential difference between the input terminals, so that the nonlinearity through the first and second input buffers can be corrected effectively.

Thus, according to the invention, the first differential amplifier, which is connected to a pair of input terminals and an output terminal, and the second differential amplifier whose input side is connected to a pair of input terminals, are identical in constitution, and the emitter current of the first and second input transistors of the input side of the first differential amplifier corresponds to the collector current of the second differential amplifier, and thereby the nonlinearity due to base-emitter junction characteristic is corrected, and the range of input voltage that can be amplified in a small distortion state can be widened. Since the linear range is widened, it is possible to compose a differential amplifier circuit of a broad dynamic range suppressed in distortion over a wide range of input voltage.

Also according to the invention, by employing the current mirror circuit, the first and second input buffers cause the correspondence of the collector current of the second differential transistors to the emitter current of the first and second input transistors, and a simple semiconductor integrated circuit can be formed easily, so that the linearity of the input voltage can be improved.

Further according to the invention, since the first and second differential amplifiers, and the first to fourth input buffers have the same constitution, and the characteristic can be easily matched on the semiconductor integrated circuit, and the range of linearity of response to the input potential difference can be easily expanded.

BRIEF DESCRIPTION OF THE DRAWINGS

Other and further objects, features, and advantages of the invention will be more explicit from the following detailed description taken with reference to the drawings wherein.

DETAILED DESCRIPTION OF THE PREFERRED EMBODIMENTS

Figure 1:
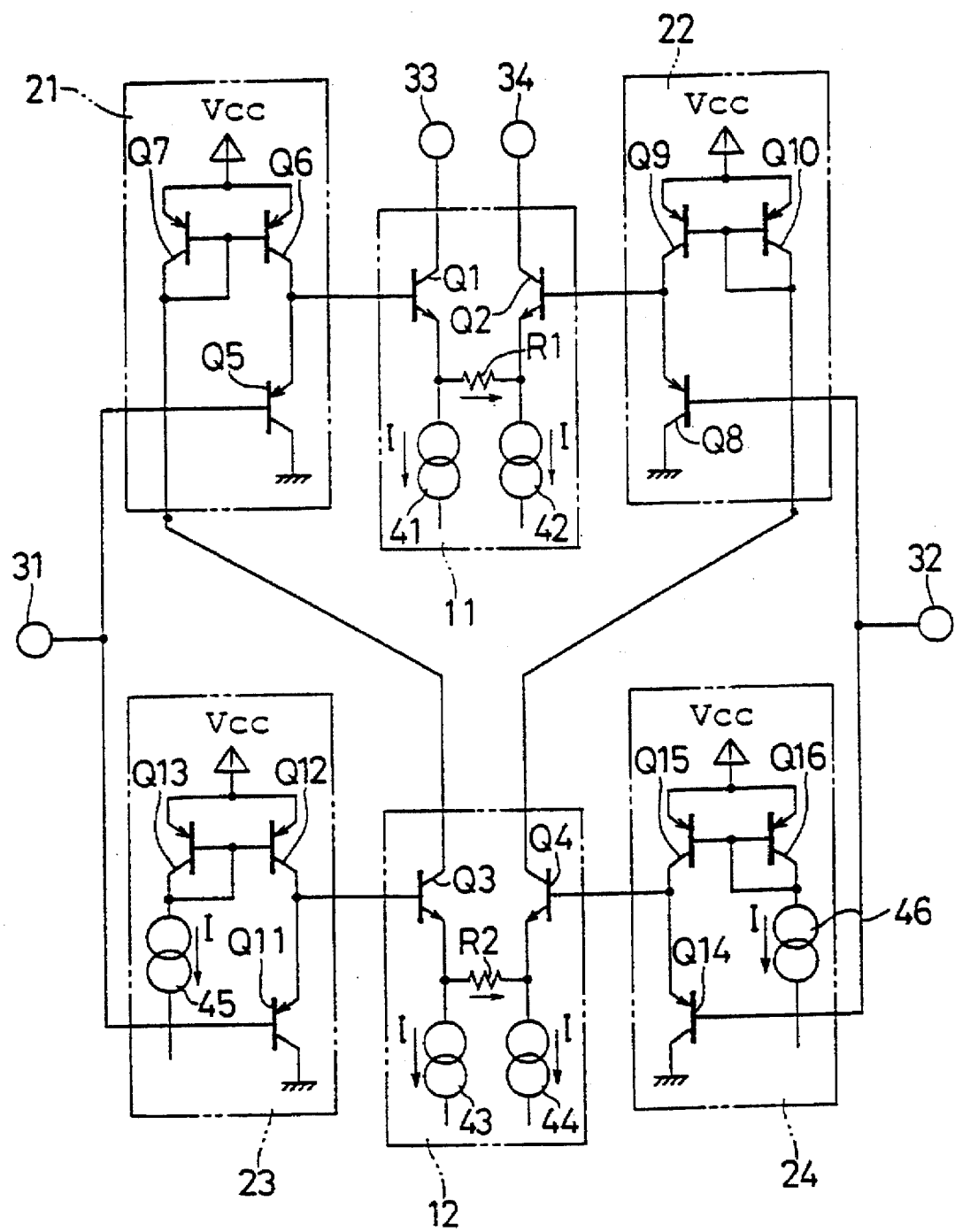
FIG. 1 is a block diagram showing a basic constitution of an embodiment of the invention.

Now referring to the drawings, preferred embodiments of the invention are described below.

Figure 2:
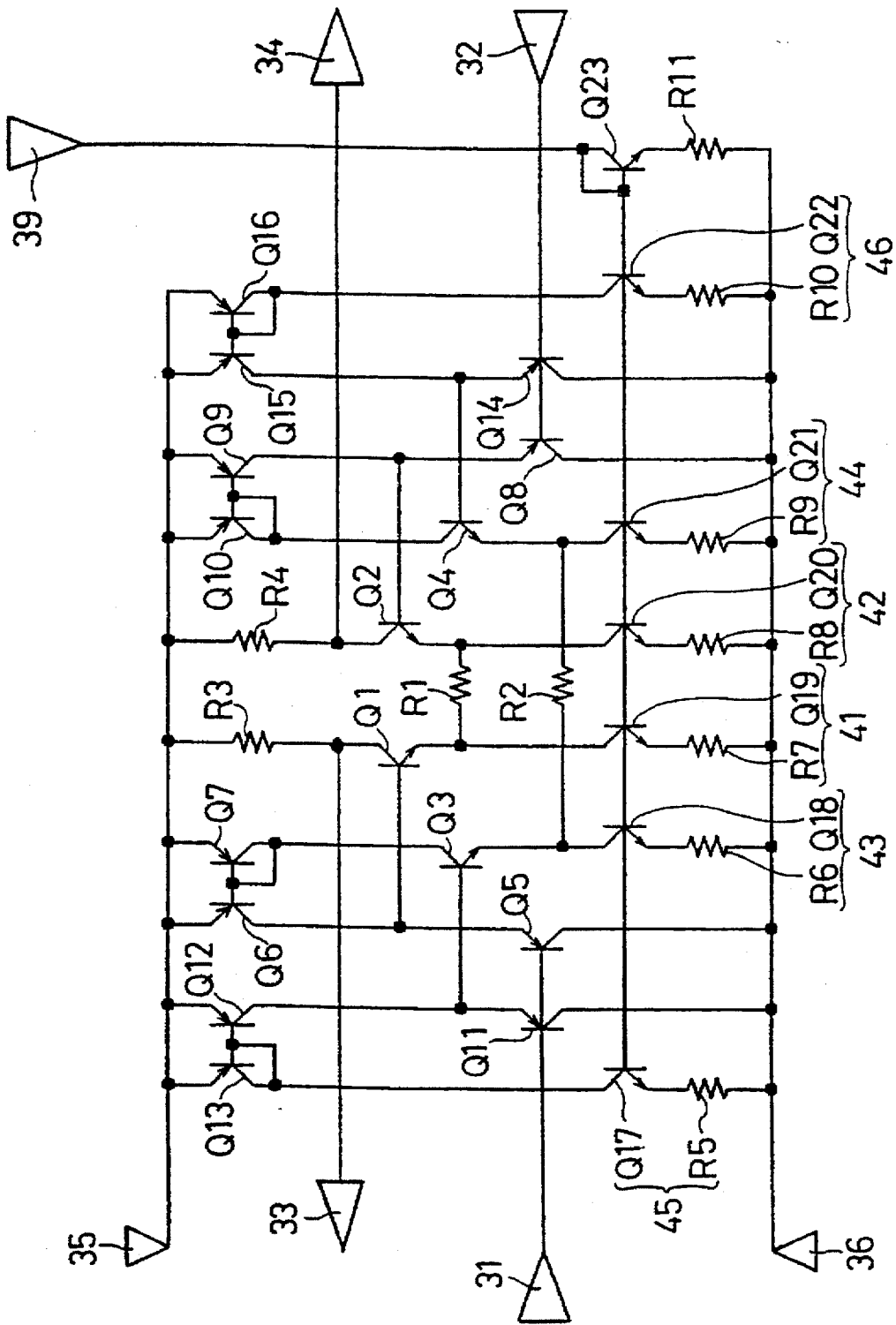
FIG. 2 is a circuit diagram showing an electric constitution of the embodiment in FIG. 1.

FIG. 1 shows a basic constitution of an embodiment of the invention, and FIG. 2 illustrates an electric constitution of the embodiment of FIG. 1 realized on a semiconductor integrated circuit. In this embodiment, a first differential amplifier 11 and a second differential amplifier 12 of the same constitution are provided. At the input side of the first differential amplifier 11, a first input buffer 21 and a second input buffer 22 of the same constitution are provided. At the input side of the second differential amplifier 12, a third input buffer 23 and a fourth input buffer 24 of the same constitution are provided. A positive phase input terminal 31, which is one of a pair of input terminals, is connected to the input side of the first input buffer 21 and third input buffer 23. A negative phase input terminal 32, which is the other one of a pair of input terminals, is connected to the input side of the second input buffer 22 and fourth input buffer 24. From the first differential amplifier 11, a differential output is derived through a negative phase output terminal 33 and a positive phase output terminal 34 which form a pair of output terminals. As the supply voltage, Vcc is applied through a positive power source terminal 35, and a negative power source terminal 36 is grounded. A bias input terminal 39 provides an input voltage for adjusting the current I to flow in constant current sources 41, 42 in the first differential amplifier 11, constant current sources 43, 44 in the second differential amplifier 12, a constant current source 45 in the third input buffer, and a constant current source 46 in the fourth input buffer.

The first differential amplifier 11 includes a first differential transistor composed of a pair of bipolar NPN transistors Q1 and Q2, and a first resistance R1 inserted between the emitters of the transistors Q1 and Q2. The second differential amplifier 12 includes a second differential transistor composed of NPN transistors Q3 and Q4 of the same conductive type as in the first differential amplifier, and a second resistance R2 inserted between the emitters. The resistance values of the first and second resistances are, for example, 10 kilo-ohms. The second differential transistor has almost the same characteristics as the first differential transistor has, and the resistance value of the second resistance R2 is also the same as the resistance value of the first resistance R1, thereby matching the first differential amplifier 11 and second differential amplifier 12.

In the first input buffer 21, FNP type transistors Q5, Q6 and Q7 of a different conductive type from that of the transistors Q1 and Q2 of the first differential transistor are included. The base of the transistor Q5 as the first input transistor is connected to the positive phase input terminal 31, the collector is grounded, and the emitter is connected to the collector of the transistor Q6. The transistor Q6 is formed in the same characteristic as the transistor Q7, and the base and emitter of the transistor Q6 is connected in common with the transistor Q7, respectively, thereby composing a current mirror circuit. The commonly connected emitters are connected to the supply voltage Vcc supplied from the positive power source terminal 35, and the commonly connected bases are connected to the collector of the transistor Q7, and connected to the collector of one transistor Q3 of the second differential amplifier 12. The transistor Q6 is at the output side of the current mirror circuit, and the transistor Q7 is at the input side of the current mirror circuit, and the same current as the current flowing to the input side is caused to flow to the output side.

The second input buffer 22 is also structured identically with the first input buffer 21, and comprises a transistor Q8 which is a second input transistor, and transistors Q9 and Q10 which compose a current mirror circuit. At the connection point of the emitter of the transistor Q8 and the collector of the transistor Q9, the base of the other transistor Q2 of the first differential transistor is connected. The collector of the transistor Q10 for composing the current mirror together with the transistor Q9 is commonly connected to the bases of the transistor Q9 and transistor Q10, and is also connected to the collector of the other transistor Q4 of the second differential transistor. The transistor Q10 is at the input side, and the transistor Q9 is at the output side.

The third and fourth input buffers 25 and 24 interposed between the second differential amplifier circuit 12 and the positive phase input terminal 31 and between the second differential amplifier circuit 12 and the negative phase input terminal 32, respectively, are the same in basic constitution as the first and second input buffers 21 and 22. The third and fourth input buffers 23 and 24 comprise transistors Q11 and Q14 which are third and fourth input transistors, respectively, and transistors Q12, Q13; Q15, Q16 which respectively compose current mirror circuits.

In FIG. 2, the resistance values of resistances R3 and R4 connected between the collectors of the transistors Q1 and Q2 and the positive power source terminal 35 are equal, for example, 10 kilo-ohms. The NPN type transistors Q17, Q18, Q19, Q20, Q21, Q22, and Q23 each having bases connected in common have the same characteristics, and sufficiently large in $h_{FE}$, and the resistance values of resistances R8, R6, R7, R8, R9, R10, and R11 connected between the respective emitters of the transistors Q17, Q18, Q19, Q20, Q21, Q22 and Q23 and the negative power source terminal 36 are equal, for example, 3 kilo-ohms. The transistors Q19 and Q20 and resistances R7 and R8, transistors Q18 and Q21 and resistances R6 and R8, and transistors Q17 and Q22 and resistances R5 and R10 respectively compose current mirror circuits with the transistor Q23 and resistance R11. Therefore, the transistor Q19 and resistance R7, transistor Q20 and resistance R8, transistor Q18 and resistance R6, transistor Q21 and resistance R8, transistor Q17 and resistance R8, and transistor Q22 and resistance R10 respectively compose constant current sources 41, 42, 43, 44, 45, and 46 as shown in FIG. 1, which are constant current sources for sucking the same current as the current flowing in from the bias input terminal 39.

Figure 3:
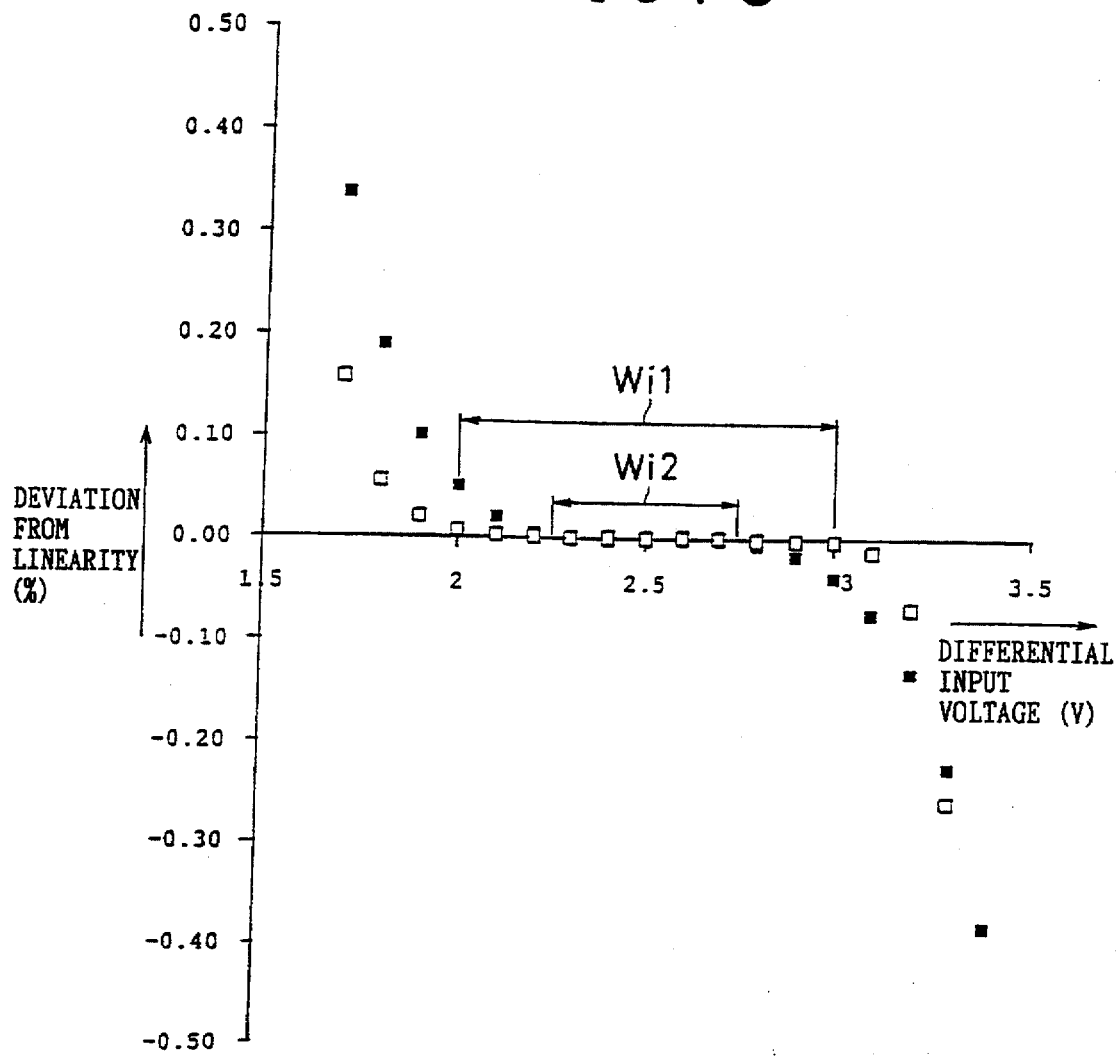
FIG. 3 is a graph showing an operation characteristic of the constitution in FIG. 2.
Figure 5:
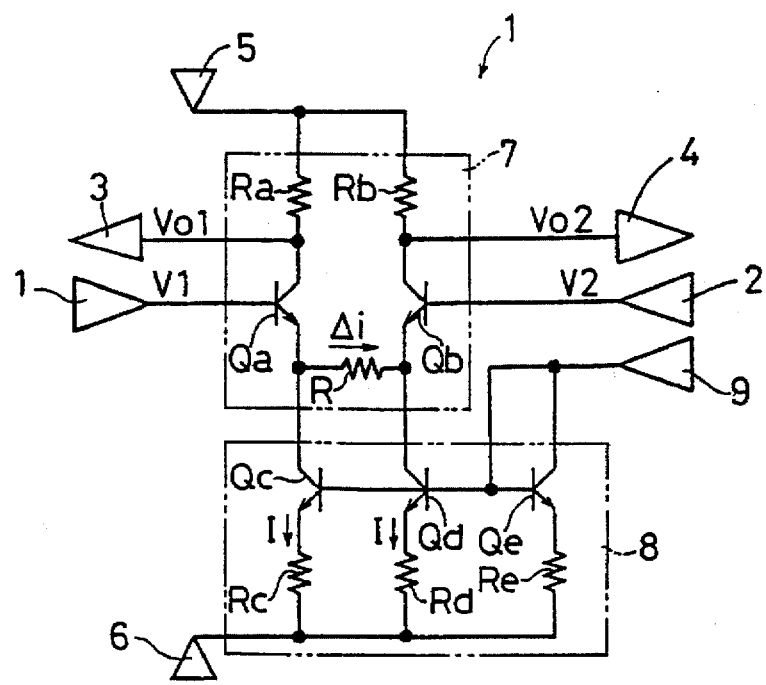
FIG. 5 is an electric circuit diagram of a typical conventional differential amplifier circuit.
Figure 6:
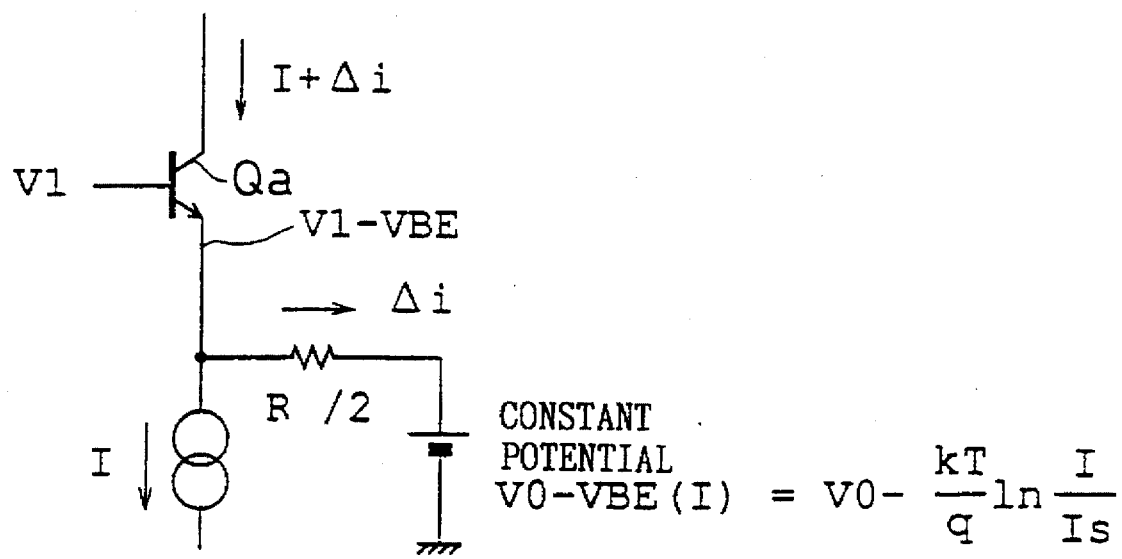
FIG. 6 is a partial electric circuit diagram of the left side of two equal divisions of the constitution in FIG. 5.

FIG. 3 shows a differential input characteristic realized by an electric constitution in FIG. 2. In FIG. 3, the axis of abscissas shows differential input voltages in units of volt. The axis of ordinates shows deviations from a linear portion in units of percent, for representing characteristics of the differential output voltage to the differential input voltage. The linearity range Wi1 of the operating characteristic of the embodiment plotted by □ mark is wider than the linearity input voltage range Wi2 of the operating characteristic in the constitution i FIG. 5 plotted by ■-mark, and it is known that the linearity is improved. By the improvement of linearity, a wider dynamic range of the analog signal to be processed in the semiconductor integrated circuit is realized, and hence the precision can be enhanced, for example, when converting to digital signal.

Figure 4:
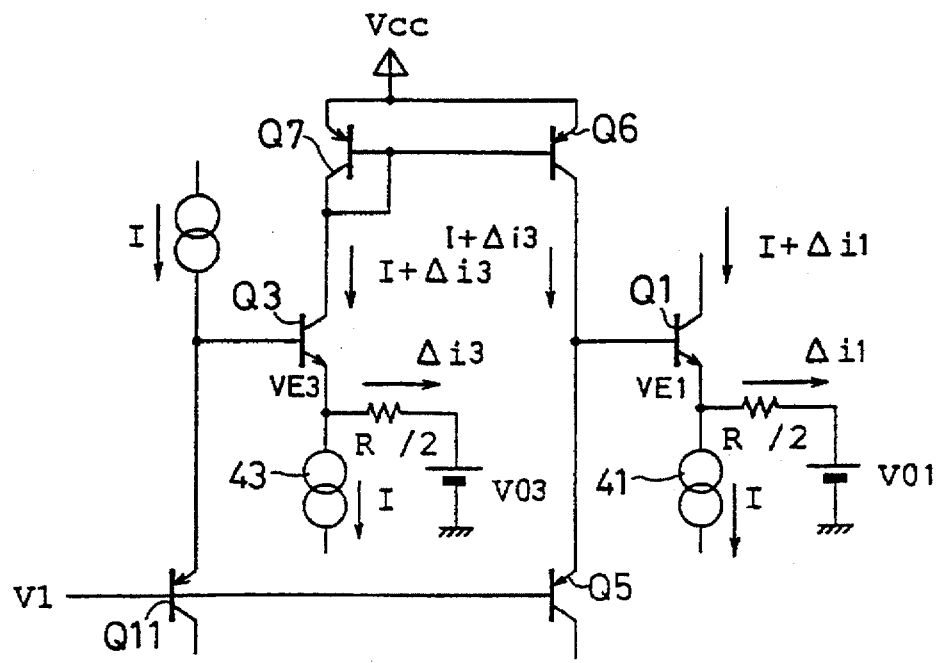
FIG. 4 is a partial circuit diagram showing the left side of two equal divisions of the embodiment in FIG. 1.

FIG. 4 shows the left side of two equal divisions of the constitution of FIGS. 1 and 2. The input terminal voltage V1 is supposed to be V0 when there is no signal. When there is no signal, that is, at the time of V1=V0, division point potentials of resistances R1 and R2 equally divided in two portions are supposed to be V01 and V03, respectively. The base-emitter voltages VBE of the transistors Q1, Q3, Q5, and Q11 are respectively supposed to be VBE1, VBE3, VBE5, and VBE11, and they can be regarded as functions of working currents, and hence they are described, for example, as VBE1=VBEi(I). Saturation inverse currents Is of the transistors Q1, Q3, Q5, and Q11 are respectively supposed to be Is1, Is3, Is5, and Is11. Supposing the emitter potentials of the transistors Q1 and Q3 to be VE1 and rE3, the following equations 4 to 9 are obtained.

$$VE3=V1+VBE11(I)-VBE3(I+\Delta i3)=V1+(kT/q)\cdot\ln(I/Is11)-(kT/q)\cdot\ln((I+\Delta i3)/Is3) \quad (4)$$

$$V03=V0+(kT/q)\cdot\ln(I/Is11)-(kT/q)\cdot\ln(I/Is3)=V0+(kT/q)\cdot\ln(Is3/Is11) \quad (5)$$

$$\Delta i3=\{1/(R/2)\}\cdot(VE3-V03)=\{1/(R/2)\}\cdot\{V1-V0-(kT/q)\cdot\ln(1+\Delta i3/I)\} \quad (6)$$

$$VE1=V1+VBE5(I+\Delta i3)-VBE1(I+\Delta i1)=V1+(kT/q)\cdot\ln((I+\Delta i3)/Is5)-(kT/q)\cdot\ln\{(I+\Delta i1)/Is1\} \quad (7)$$

$$V01=V0+(kT/q)\cdot\ln(I/Is5)-(kT/q)\cdot\ln\{(I+\Delta i1)/Is1\}=V0+(kT/q)\cdot\ln(Is1/Is5) \quad (8)$$

$$\Delta I1=\{1/(R/2)\}\cdot(VE1-V01)=\{1/(R/2)\}\cdot[V1-V0+(kT/q)\cdot\ln\{1+(\Delta i3-\Delta i1)/I\}] \quad (9)$$

The output current component is expressed in equation 9. In equation 9, since the nonlinear terms are canceled by $\Delta i3$ and $\Delta i1$, it is close to 0 in the case of $\Delta i3-\Delta i1 \ll I$, and a favorable linearity can be obtained.

In this embodiment, by the first to fourth input buffers 21 to 24, the emitter currents of the first to fourth input transistors Q5, Q8, Q11, and Q14 are set by using the current mirror circuit, but they may be set by using another constitution. By using the current mirror, the current can be corrected most easily. Meanwhile, although the differential transistors are of NPN type and the input buffers are of PNP type, but the conductive types may be also inverted.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and the range of equivalency of the claims are therefore intended to be embraced therein.

What is claimed is:

1. A differential amplifier circuit comprising:

a first differential amplifier including bipolar transistors at input sides thereof, a second differential amplifier constituted to be matched with the first differential amplifier, first and second input buffers coupled to the respective input sides of the first differential amplifier, and current feeding means for feeding output current of the second differential amplifier as operating current of the first and second input buffers.

2. The differential amplifier circuit of claim 1, wherein the current feeding means comprises a current mirror circuit.

3. The differential amplifier circuit of claim 1, wherein third and fourth input buffers are coupled to the respective input sides of the second differential amplifier.

4. A differential amplifier circuit for deriving an output corresponding to a potential difference between potentials inputted to a pair of input terminals, from between a pair of output terminals, the differential amplifier comprising:

a first differential amplifier including a pair of first differential bipolar transistors of one conductive type of NPN type and PNP type, between whose emitters a first resistance is inserted, and whose collectors are connected to the pair of output terminals, respectively;

a first input buffer provided with a first input transistor of the other conductive type of NPN type and PNP type, different from the conductive type of the first differential bipolar transistors, whose emitter is connected to the base of one of the pair of first differential transistors, and whose base is connected to one of the pair of input terminals;

a second input buffer provided with a second input transistor of the same conductive type as the first input transistor, having nearly the same characteristics as the first input transistor has, whose emitter is connected to the base of the other of the pair of first differential transistors, and whose base is connected to the other of the pair of input terminals;

a second differential amplifier including a pair of second differential transistors of the same conductive type as the first differential transistors, having nearly the same characteristics as the first differential transistors have, between whose emitters a second resistance is inserted;

a third input buffer interposed between the base of one of the second differential transistors and the one input terminal, and a fourth input buffer interposed between the base of the other of the second differential transistors and the other input terminal, wherein the first and second input buffers transmit the currents corresponding to the collector currents of the one and the other of the second differential transistors, into the first and second input transistors, respectively.

5. The differential amplifier circuit of claim 4, wherein the first and second input buffers are respectively provided with current mirror circuits, wherein the collector currents of the second differential transistors are coupled to input sides of the current mirror circuits, and then feed the currents corresponding to the collector currents to the emitters of the first and second input transistors from output sides of the current mirror circuits, respectively.

6. The differential amplifier of claim 4, wherein the third and fourth input buffers have the same constitution as the first and second input buffers have, and include third and fourth input transistors inserted between the respective bases of the second differential transistors and the respective input terminals wherein, the third and fourth input transistors are driven at a constant current.

* * * * *